(12) United States Patent
Forbis et al.

(10) Patent No.: US 8,851,144 B2
(45) Date of Patent: Oct. 7, 2014

(54) MODULAR PANELS FOR PROTECTING A STRUCTURE

(76) Inventors: Jack R. Forbis, Tulsa, OK (US); Ann R. Forbis, Tulsa, OK (US)

( * ) Notice: Subject to any disclaimer, the term of this patent is extended or adjusted under 35 U.S.C. 154(b) by 508 days.

(21) Appl. No.: 13/118,791

(22) Filed: May 31, 2011

(65) Prior Publication Data

US 2011/0226425 A1    Sep. 22, 2011

Related U.S. Application Data

(63) Continuation of application No. 12/011,595, filed on Jan. 28, 2008, now abandoned.

(51) Int. Cl.
| | |
|---|---|
| A47G 5/00 | (2006.01) |
| E04B 2/74 | (2006.01) |
| E06B 9/52 | (2006.01) |
| E04C 2/38 | (2006.01) |
| E04B 1/80 | (2006.01) |
| H01L 31/042 | (2014.01) |
| B60J 1/20 | (2006.01) |
| F24J 2/52 | (2006.01) |
| F24J 2/46 | (2006.01) |

(52) U.S. Cl.
CPC ............. *E04C 2/384* (2013.01); *E04B 2/7422* (2013.01); *A47G 5/00* (2013.01); *E04B 2002/7479* (2013.01); *B60J 1/2011* (2013.01); *E04B 1/80* (2013.01); *F24J 2/52* (2013.01); *F24J 2002/4659* (2013.01); *H01L 31/042* (2013.01); *Y02E 10/50* (2013.01)
USPC ........... 160/135; 160/351; 160/378; 160/379; 160/381; 52/222

(58) Field of Classification Search
CPC ....... A47G 5/00; B60J 1/2011; E04B 2/7401; E04B 2/7405; E04B 2/7422; E04B 2/7427; E04B 2/7431; E04B 2002/74; E04B 2002/7479; E04B 2009/0492; E06B 9/52; E06B 11/02
USPC ............. 52/63, 222, 81.2; 160/378, 379, 381, 160/135, 351, 374.1
See application file for complete search history.

(56) References Cited

U.S. PATENT DOCUMENTS

| | | | | |
|---|---|---|---|---|
| 135,389 | A | * | 1/1873 | Van Est .......................... 160/379 |
| 1,324,234 | A | * | 12/1919 | Daigre ............................... 2/2.5 |

(Continued)

FOREIGN PATENT DOCUMENTS

| | | |
|---|---|---|
| JP | 114028 | 1/2005 |
| KR | 0304748 | 2/2003 |

*Primary Examiner* — Michael Safavi
(74) *Attorney, Agent, or Firm* — Head, Johnson & Kachigian, P.C.

(57) ABSTRACT

An innovative, low-density, highly-insulating modular panel for use in many applications and industries. The panel consists of a frame that may be preformed or bent and may be made of rigid or flexible material, and a panel covering comprising at least one pocket of thin, low-density shade fabric that has the capability of sufficiently stretching to surround the frame when the pocket is pulled onto it. The pocket may be then secured, along any previously open end where the frame was inserted, by various fastening devices. The panel covering pocket may have additional features added, as described herein. The panel is durable and cost-effective, and has good solar-control and insulating qualities. It is also a windbreak panel, a noise-reduction panel, an impact protection panel, a water-resistant panel, a fall protection panel, and a pollution-control panel. Two or more panels can be joined to create a structure-protecting panel assembly or system.

13 Claims, 5 Drawing Sheets

(56) References Cited

U.S. PATENT DOCUMENTS

| | | | | |
|---|---|---|---|---|
| 1,400,717 | A * | 12/1921 | Benson et al. | 297/452.4 |
| 1,422,915 | A * | 7/1922 | Benson et al. | 160/352 |
| 2,193,469 | A * | 3/1940 | Ashton | 160/352 |
| 2,266,854 | A * | 12/1941 | Davis | 160/131 |
| 2,470,416 | A * | 5/1949 | Silver | 428/81 |
| 2,484,984 | A * | 10/1949 | Davis | 160/352 |
| 2,641,779 | A * | 6/1953 | Gill | 5/53.1 |
| 2,645,540 | A * | 7/1953 | Trimble et al. | 160/378 |
| 2,840,161 | A * | 6/1958 | Alexander et al. | 160/377 |
| 2,888,072 | A * | 5/1959 | Nicholas | 160/377 |
| 3,600,035 | A * | 8/1971 | Vondrejs | 297/10 |
| 3,709,237 | A * | 1/1973 | Smith | 135/87 |
| 3,713,474 | A * | 1/1973 | Orlando | 160/351 |
| 3,875,711 | A * | 4/1975 | Palmer | 52/239 |
| 4,062,589 | A * | 12/1977 | Klein et al. | 297/450.1 |
| 4,121,645 | A * | 10/1978 | Behr | 160/135 |
| 4,134,439 | A * | 1/1979 | Scott | 160/135 |
| 4,179,830 | A * | 12/1979 | Lamb | 38/102.5 |
| 4,224,754 | A * | 9/1980 | Derryberry | 43/1 |
| 4,448,003 | A | 5/1984 | Hasbrouck | |
| 4,516,620 | A * | 5/1985 | Mulhern | 160/351 |
| 4,526,250 | A * | 7/1985 | Messinger | 181/295 |
| 4,635,417 | A * | 1/1987 | Larouche | 52/239 |
| 4,761,908 | A * | 8/1988 | Hayes | 43/1 |
| 4,798,019 | A * | 1/1989 | Sury et al. | 43/1 |
| 4,821,349 | A * | 4/1989 | Cohen | 5/53.1 |
| 4,860,467 | A * | 8/1989 | Larson | 38/102.4 |
| 5,058,863 | A * | 10/1991 | Maffet | 256/26 |
| 5,070,665 | A * | 12/1991 | Marrin et al. | 52/239 |
| 5,414,950 | A * | 5/1995 | Johnson, Sr. | 43/1 |
| 5,415,194 | A * | 5/1995 | Kaye | 135/115 |
| 5,531,258 | A * | 7/1996 | Poulson et al. | 160/376 |
| 5,537,766 | A * | 7/1996 | Nickens et al. | 40/605 |
| 5,595,233 | A * | 1/1997 | Gower | 160/232 |
| 5,941,265 | A * | 8/1999 | Zheng | 135/125 |
| 6,009,673 | A * | 1/2000 | Adams | 52/79.1 |
| 6,145,528 | A * | 11/2000 | Egnew et al. | 135/128 |
| 6,161,320 | A * | 12/2000 | Peterson | 40/605 |
| 6,164,005 | A * | 12/2000 | Copeland | 43/1 |
| 6,206,079 | B1 * | 3/2001 | Selgrad | 160/351 |
| 6,371,190 | B1 * | 4/2002 | Owens | 160/135 |
| 6,374,565 | B1 * | 4/2002 | Warren | 52/653.2 |
| D458,040 | S * | 6/2002 | Stannis et al. | D6/332 |
| 6,516,571 | B1 * | 2/2003 | Overthun et al. | 52/36.1 |
| 6,926,020 | B2 * | 8/2005 | Zheng | 135/126 |
| 7,152,902 | B2 * | 12/2006 | Moen et al. | 296/100.18 |
| 7,246,468 | B2 * | 7/2007 | Forbis et al. | 52/3 |
| 7,615,962 | B1 | 11/2009 | Kuelbs | |
| 8,015,737 | B2 * | 9/2011 | Venegas, Jr. | 40/607.03 |
| 2007/0212253 | A1 * | 9/2007 | Elrod | 422/5 |
| 2010/0011641 | A1 | 1/2010 | Hill | |
| 2012/0063951 | A1 * | 3/2012 | Elrod | 422/5 |

* cited by examiner

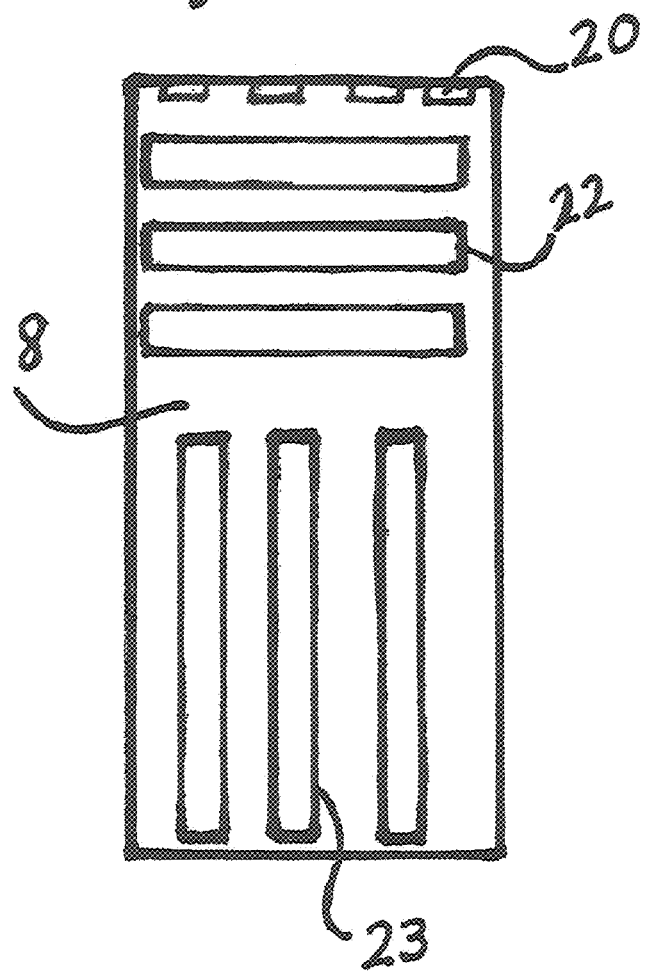

MODULAR PANELS FOR PROTECTING A STRUCTURE

CROSS REFERENCE

This application is a continuation of and claims priority to co-pending U.S. patent application Ser. No. 12/011,595 filed Jan. 28, 2008.

BACKGROUND OF THE INVENTION

Field of the Invention

The present invention relates to, and consists of, a unique, modular panel that has significant insulating and protective characteristics along with many uses/applications in various industries. The modular panel of the present invention serves as a new type of "shade panel" (which alone or in combination with other like or identical panels create a new type of "shade structure" or "shading device"). The panel of the present invention additionally can be utilized as a new and improved type of windbreak panel and as a greatly improved hail-protection panel. The innovative panels of the present invention represent significant improvement over previously-available, or conceived-of, technologies or products primarily due to their enhanced performance regarding heat blocking capacity, hail/impact protection and wind blocking/wind deflection capabilities. This panel may also serve as a new type of sound absorbing/acoustic panel; and, in another application, as an improved, more efficient photovoltaic (PV) panel for generating electricity from sunlight. Thus the panel of the present invention (when used to produce energy, to save energy and/or to provide other environmental benefits) will create and qualify for—either alone or in combination with other systems/products—environmental credits such as carbon and/or NOX-reduction credits, renewable energy credits (RECs) and/or Emission Reduction Credits (ERCs).

Over the years, various solar-control products have been developed for windows and glazed areas of buildings; for example, awnings and window solar screens. Many types of stand-alone canopies and shade structures have been developed to shade people, vehicles, plants and animals (and in some situations, to also help protect against hail damage, especially where agricultural crops are concerned). Many such free-standing canopies and/or greenhouse structures can be found by searching the Internet and in company catalogs such as those from Farm Tek. A roof-shading invention, Forbis et al, U.S. Pat. No. 6,161,362, is also an innovation in providing beneficial shade in a building application. An above-ground storage tank (AST) shade system, disclosed in another Forbis et al patent, U.S. Pat. No. 7,246,468 B2, provides shading/cooling to an AST thereby helping prevent or lessen emissions to the atmosphere. The traditional method of constructing and installing shade structures such as greenhouse shade-houses (and/or cold frames) and canopies consists of erecting a framework structure (normally of metal) then tightly pulling or stretching "cover" sheets or "tarps" of canvas, non-porous plastic(s) or shade cloth over the top of the framework and securing the cover material to the framework by utilizing bungee-type ties that are made to go through holes (or "grommets") that have been fabricated into the covering sheets for that purpose. Alternatively, UV-treated polyrope has been used to fasten the covering to the frame, going through the grommets and around the frame in a lacing pattern. Often, various types of ground anchors are utilized to further secure the canopy structure. Some freestanding canopies, such as those commonly found at parks/playgrounds, and often at automobile dealerships protecting selected vehicles (or rows or groupings of vehicles) are known as tensioned fabric structures. Large sections of a thin material are narrowly hemmed around the edges and wire or cable is inserted through the hems; then when installed, tension is applied to force the structure to take its desired shape. Substantially large support poles or beams are also necessary for these structures. Constructing shade structures of many types have various challenges, such as handling large sheets or sections of shade materials, especially in windy conditions. If shade structures are envisioned and built that do not utilize a "tensioned fabric" strategy or method, then sagging or drooping of the shade material normally occurs. This may not be a concern in many applications, but in others, it can pose an aesthetic concern or it may result in a product that is not as efficient or as easy to install or handle. The need exists for user-friendly, easily-handled shade panels that do not have some of the drawbacks of existing or previously invented products/systems. That need also includes the ability to create, provide, and install valuable shading panels that are of a much more manageable size and which can be easily installed no matter what the environmental conditions, including windy conditions.

That need further encompasses desires within the engineering and architectural communities for new, more highly-efficient products (including more efficient renewable energy/solar electric systems) which may be utilized in green building projects, industrial/manufacturing locations, etc. The need exists for a solar-control (and wind-blocking or hail-blocking) product that has a very long service life, has low maintenance requirements, and which may be easily reversed seasonally, or as often as desired, to further increase its service life. The panel of the present invention fulfills those needs.

SUMMARY OF THE INVENTION

In general, in a first aspect, the invention relates to a system of modular panels for protecting a structure. The system comprises at least one preformed or bent frame and at least one covering into which the frame is receivable. The covering is made from shade fabric and is pocket-shaped, such that the covering has at least one first layer, at least one second layer, a plurality of closed sides adjoining the first layer and the second layer, and at least one open side, such that the covering may be pulled onto the frame via the open side to form a modular panel.

The system of modular panels may further comprise fasteners located along the open side of the covering such that the open side of the covering may be closed after the covering has been pulled onto the frame. The fasteners may be hook and loop fasteners or c-clips. The system of modular panels may further comprise an air space formed within the modular panel by the frame when the covering surrounds the frame, and insulation material within the air space.

The frame may be comprised of four corner pieces and four side segments, where the four side segments connect to the four corner pieces to form a rectangular frame. The frame may be comprised of two u-shaped components and two side segments, where the two side segments connect to the two u-shaped components to form a rectangular frame. The frame may be made of flexible material such that the modular panel may conform to a curved structure to be protected by the modular panel. The frame may be foldable or collapsible.

The system of modular panels may further comprise at least one connecting plate assembly, each connecting plate assembly comprising two connecting plates and a plurality of fasteners, such that a connecting plate assembly may be used to join two or more modular panels into a larger unit by sandwiching one corner of each of the two or more modular panels between two connecting plates and joining the connecting plates together with the fasteners. The system of modular panels may further comprise a plurality of panel support cushions. The system of modular panels may further comprise a fastener for mounting the at least one modular panel to an external surface of a structure. The covering may further comprise photovoltaic material whereby sunlight striking the modular panel can be converted into electricity.

In a second aspect, the invention relates to a system of modular panels for protecting a structure, comprising: at least one preformed or bent frame, where the frame is comprised of two u-shaped components and two side segments, where the two side segments connect to the two u-shaped components to form a rectangular frame; and at least one covering into which the frame is receivable, where the covering is made from shade fabric, such that the covering has at least one first layer, at least one second layer, a plurality of closed sides adjoining the first layer and the second layer, and at least one open side, such that the covering may be pulled onto the frame via the open side to form a modular panel. The covering further comprises at least one of the following features: the covering is tube-shaped; the covering further comprises photovoltaic material whereby sunlight striking the modular panel can be converted into electricity; the covering is made from shade fabric that is water resistant; the covering is made from shade fabric that is polyethylene combined with shade fabric that is polypropylene; the covering is made from shade fabric used in combination with commercially-available hail-netting; the covering further comprises strips or sections of non-stretchy material attached thereto. The system of modular panels may further comprise at least one of the following features: a water misting system or a drip system, such that water may be delivered to the modular panels, providing enhanced cooling to a structure; an air space formed within the modular panel by the frame when the covering surrounds the frame, and insulation material within the air space; the modular panels are capable of being turned or reversed from time to time to expand the life of the panels.

In a third aspect, the invention relates to a method of protecting at least one part of a structure with a system of modular panels, comprising: pulling at least one covering onto at least one preformed or bent frame to form at least one modular panel, where the covering is made from shade fabric and is pocket-shaped, such that the covering has a first layer, a second layer, a plurality of closed sides adjoining the first layer and the second layer, and at least one open side; and protecting a structure with the at least one modular panel. The method of protecting at least one part of a structure may further comprise joining two or more modular panels into a larger unit using at least one connecting plate assembly, where each connecting plate assembly comprises two connecting plates and a plurality of fasteners, where joining two or more modular panels into a larger unit comprises sandwiching one corner of each of the two or more modular panels between two connecting plates and joining the connecting plates together with the fasteners. The method of protecting at least one part of a structure may further comprise protecting the structure from potential harm from the connecting plates by inserting a panel support cushion between each connecting plate assembly and the structure. The method of protecting at least one part of a structure may further comprise attaching the at least one modular panel to an external surface of the structure. The covering may further comprise photovoltaic material, and the method may further comprise converting sunlight striking the at least one modular panel into electricity. Protecting the structure with the at least one modular panel may comprise one or more of the following: reflecting or refracting incoming sunlight; deflecting wind; providing impact protection; providing noise reduction; providing fall protection; providing water-resistance; providing improved pollution-control; providing energy use reduction in summer or winter months; providing infrared heat protection; and creating environmental credits.

BRIEF DESCRIPTION OF THE DRAWINGS

FIG. 6 illustrates the corners of four panels of the present invention coming together and being held in place by this universal connecting plate.

FIG. 11 illustrates another type of finished panel which has several strips of highly-insulating, non-stretchy material sewn, affixed, and/or securely attached to the more stretchy "tube" or "pocket" (panel covering) of the panel of the present invention. This alternate panel covering is then pulled over, and fastened in place, around any suitable frame as shown in FIG. 1, 4, or 5.

DETAILED DESCRIPTION OF THE INVENTION

Figure 1:
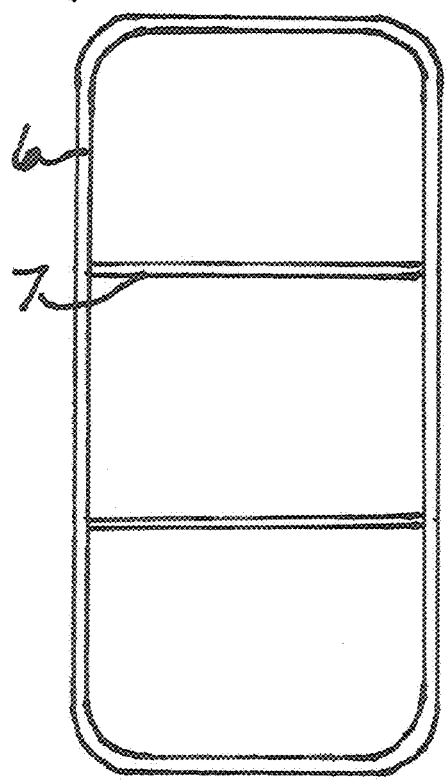
FIG. 1 illustrates a bent frame, being viewed from above, having optional cross-bracing components (represented by the numeral 2).

The devices and methods discussed herein are merely illustrative of specific manners in which to make and use this invention and are not to be interpreted as limiting in scope.

While the devices and methods have been described with a certain degree of particularity, it is to be noted that many modifications may be made in the details of the construction and the arrangement of the devices and components without departing from the spirit and scope of this disclosure. It is understood that the devices and methods are not limited to the embodiments set forth herein for purposes of exemplification.

In general, in a first aspect, the invention relates to a new, unique, lightweight, modular panel that has excellent insulating characteristics and has many uses/applications. It consists of a sufficiently rigid framework (which is very different from traditional shade structure frameworks and which, in most applications, may be rectangular in shape but also may be square, triangular, hexagonal or any other shape desired for structural or aesthetic reasons) which is covered completely/surrounded by a lightweight, low-density, highly-insulating fabric or material that is adequately flexible or "stretchy" enough so that, when sewn into a tube or into a "pocket" configuration, can be pulled onto and over the frame. The panel covering tube (or alternatively, pocket) actually becomes self-tensioning due to its ability to slightly stretch and surround a frame of slightly larger dimensions. The flexibility and slight "give" of the preferred panel covering materials allow them to be pulled over any selected/suitable frames. This panel is unique and innovative because panels of this type have never been made before of such material (for instance, shading materials as used in the greenhouse/horticulture industry). With such lightweight, low-density, highly-insulating materials sewn into a tube (having two seams and two open ends) or into a pocket shape (having three seams and one open end for framework insertion), many key benefits have been discovered, including the following:

The panel of the present invention becomes a panel that has twice the shade material as any other previously existing shade product. Fabricated and assembled into a modular, easily handled size, the panel covering tube (or pocket) becomes perfectly self-tensioning immediately as soon as it is pulled onto the selected frame. This takes away a major problem or concern when trying to apply this type of fabric/material to any type of structure; the fabric/material does not sag or droop if this panel is built properly.

The two layers of fabric/material surrounding the framework create an air space of approx 1½ inches (or more of less, depending upon the dimensions of the selected frame). Air is a very good insulator. More air space on the interior of these panels can be created by increasing the diameter or width of the frame, therefore allowing more separation between the layers of low-density, highly-insulating material (such as horticultural shade cloth/fabrics, woven or knitted of polyethylene or polypropylene threads, for instance) and therefore creating more air space in the panel's center. A "wider" section of air space may increase the panel's insulating capability. Double fabric/material layers with accompanying air space significantly increases resistance of the panel to heat flow. In most cases, and in early testing, most infrared heat simply stops at this panel and does not pass through. The panels of the present invention have been built and tested using varying materials for covering tubes/pockets, and it has been found that the overall panel has good emissivity (ability to release heat). Selecting knitted polyethylene shade fabric, for example, has been a good choice since plastic products are not good "holders" of heat and because this material is thin, lightweight and low-density. Because materials that are less dense are better insulators, such materials will be utilized as panel coverings; coupled with the interior air space, they greatly assist in the construction of a highly-insulating, yet strong and durable, panel for many useful purposes. The panel having such material on both sides of the frame, with the frame being completely enclosed in the covering tube or pocket, significantly increases resistance of panel (or anything the panel is installed over and protecting) to hail damage. As the top, or uppermost, section or the fabric/material tube is stretched by hail impact, the bottom, or underneath layer may tighten somewhat, especially if panel fabric tube or pocket is a little more loosely attached. Regardless, having double layers of protection far exceeds the amount of protection that one layer alone can provide.

Simplified fabrication/assembly is possible with the panel of the present invention. Most of these new panels can be assembled in five minutes or less, thereby helping keep labor costs at a very reasonable level. The open end or ends or the pocket or tube, respectively, can easily be secured with all-weather type hook and loop fastener and/or by C-shaped, slightly flexible clips that are commercially available for holding a layer of fabric of plastic to a section of tubing or pipe. One company offering such C-shaped clipping components is Farm Tek. Each side of panel can be treated individually for either UV or enhanced fire protection. For instance, the side of the finished panel that will received sunlight should have UV-treated material, while an underneath layer (being shaded itself by the panel's uppermost or top layer) has no need of UV-treated material and can therefore receive as much fire-protection treatment as possible. It has been a common practice in the commercial "shadecloth" industry to highly treat a shade fabric product for either UV or fire protection, but high levels of protection for both has not been possible. Customers have had to choose which type of protection they primarily want or need for the product they are purchasing. This is why the panel of the present invention is important for building applications. The highly fire-protective treatment being able to be applied to the part of the material which, on our tube or pocket, will be closest to the building is an important innovation and will prove preferable to other types of panels or products.

Panels may be covered with different colors, textures or types of fabric/material (one for each side) or a combination of fabric colors/types may be used together to cover an individual side of the panel. This may be done on one side only, or on both sides of any panel-covering tube or pocket. For energy performance, environmental goals or other considerations, panels may consist of a single, universally high-performance material (or color of material) on both sides.

Panels may also incorporate a strong, lightweight aluminized product (for example, one that is commercially available called AlumiNet) on one or both sides of the panel (and either alone or in combination with other lightweight, low-density materials). Prototype panels have been constructed with this material in combination with other panel covering materials for thermal testing and other experimentation. The AlumiNet has also been used by itself on either side of a prototype panel.

Panels may be reversed seasonally, as desired, to enhance the performance of the panel and/or to extend the service life of the overall panel or any of its components. Panels need not be installed exactly parallel to roof, wall or other surfaces, but may be installed at any angle (or in a zig-zag pattern) if desired for longevity, maintenance, performance or other reasons. Logos, messages and/or artwork may be printed onto these new panels and, also, reversed or changed as often as desired. Small, lightweight panel support cushions can be used wherever needed.

More than one fabric/material tube or pocket can be utilized, per panel, to increase strength and/or longevity of the fabric/material (or to reinforce a very thin material). For example, one tube or pocket of fabric can be pulled over the frame and secured, then another tube or pocket of a matching (or different) material can be pulled over the first and fastened in place. Alternatively, different panel covering materials may be selected and sewn or basted together (or in some cases even fastened together with certain adhesives, tapes or hook and loop fastener) by placing either "right" sides or "wrong" sides together before being fabricated into tubes or pockets for later panel assembly.

Double or even triple layering of fabrics/materials one over another before sewing into tubes or pockets may be done for one side of the panel only or for both sides. This method of creating panel coverings has already been accomplished in prototype panels, and all without the need to incorporate any "traditional" grommets into the fabrics. UV-treated thread should be used.

Multiple finished panels may be "stacked" together vertically so that there are, effectively, four layers of fabric/material (or more) pulled over two frames with two resulting air spaces. This would be especially useful for applications in which much insulation is needed or desired from a panel such as the new panel described herein. Additionally, such "stacked" panels may incorporate a spacer or another means of creating a slight separation between them to give added air space between them (rather than having them rest exactly one upon the other). The panels of the present invention provide new and unique, multipurpose, additional insulation/protection options for use on/around building envelopes as well as for many other valuable uses in industries outside of the building construction industry.

Frameworks/frames may be solid or hollow, and may be formed as one, continuous "bent" frame for strength and uniformity. Framework may be built from various materials such as galvanized steel tubing, aluminum, strong PVC, or fiberglass. Certain types of wood may also be used if desired, especially lumber that is sustainably harvested and certified. For the majority of panels, it is anticipated that a strong, lightweight galvanized steel tubing (as used in chain-link fencing "top rail") may be chosen because top rail is routinely "bent" into rectangular shapes for creating drive-through or walk-through gates. Fence supply manufacturers have "gate shops" with bending machines, and they can easily manufacture the types of panel frames needed, and frames may be cross-braced. Framework, if not pre-manufactured as a bent, gate-type frame, may be built utilizing unique, individual 90-degree angle 'corners" that are swedged on both ends so that tubing sections of a desired length may be joined to these corners, thus forming a mostly-rectangular frame when all sections are put together. These components are useful for being able to build off-sized frames for panels whenever needed (even on location at a jobsite if necessary). One example follows: two ft. lengths of galvanized tubing, bent at a 90-degree angle, may serve as corner pieces and panel size is then determined by the lengths of tubing/pipe selected to go between the respective corner components. Alternatively, frameworks can have end pieces that are U-shaped, one for each end of the rectangular panel frame; and with this option, one only needs to add side tubing sections in any length desired to complete the panel frame. These unique U-shaped pieces also are swedged on both ends to receive the side tubing sections. There are some existing connecting components that can be used to join these modular panels one to another, but unique connectors have been developed for this purpose and can be utilized to connect, not only the panels to each other, but also to roofs, walls, support platforms and/or other places that these panels may need to be installed. Special connectors can be used between, along the edges of and/or on the corners of any panel. Other key benefits of these modular panels, and each of their components, is that they are reusable, easy to handle, and mostly recyclable. When eventually required, the fabric/material tubes or pockets of these panels may be easily and simply repaired or replaced. The panel design allows for any individual panel or panels to be removed, for maintenance or other reasons, without disturbing (or specifically having to remove) adjacent panels if adjacent panels exist. All framework components and connector components can be made of any material strong enough to remain sufficiently rigid under all (or mostly-expected) conditions while still providing the necessary support of the double-sided fabric/material tubes or pockets used to cover the frames. In some applications, a totally rigid framework will not be a necessity; meaning that some amount of flexibility of the overall panel (including the framework itself) may be preferable depending upon where and to what the panel is to be applied. The panels, individually or as a grouping, can also be made waterproof for certain applications by pulling a waterproof material such as a sheet or sheets of heavy-duty, opaque plastic over the top side of the panel, if desired. These panels, then, could be used as quick, reliable, easily-built temporary/emergency shelter or housing—or even as longer term housing if needed. Tops of these panels could also have a waterproof coating product added in such applications. Waterproofing plastic sheets and/or coatings may be applied only to the underneath side of the panel, if desired, so that the top or uppermost side of the panel of the present invention would serve to shield the lower, coated or plastic-covered layer from direct sunlight and any accompanying weathering and deterioration that the sun's heat would normally cause to such plastic sheet(s) or coating. The panels of the present invention, due to their strength and insulating characteristics, can be used to provide beneficial free-standing structures themselves—giving shelter from excessive heat, cold and wind (and from hail) even if they are not made waterproof. The panels of the present invention can provide blockage of heat transfer, hail strikes and blockage/deflection of wind currents anywhere desired in many industries, including but not limited to the following: Building construction, agricultural, industrial/manufacturing (including on-shore and off-shore oil and gas production and storage), civil engineering projects and for use in renewable energy systems such as solar electric/photovoltaic systems. The panel of the present invention can serve as a brand new type of base material for the attachment of solar collectors, and it will prove to be more efficient than many other types of materials onto which solar cells/collectors have previously been mounted or affixed. If a solar panel can stay much cooler while in bright sunlight, it is more effective at producing power from that sunlight. The solar collectors can be mounted on one side, or on both sides, of the panel of the present invention. If mounted or affixed to both sides, this new, unique solar panel can then be installed in an operable position so that one side of the panel can "face" the easterly sun to generate power during the morning hours of the day; then, as the sun passes over head and "moves" to the west, the solar collectors on the other side of the panel of the present invention will receive full sunlight and they will generate power during the afternoon hours. A panel of this type, which has not existed before, may avoid the need for mounting brackets that must move throughout the day in order to "track" the sun's movement and keep the solar panel properly positioned and "facing" into the direct sunlight. In addition, the panel of the present invention may be misted with small droplets of water, on one or both sides of the panel, especially if misting could enhance the solar output of such a novel panel by helping keep it much cooler than other solar panels. The panel of the present invention may also have flexible, thin, lightweight solar-collecting tubes imbedded, or woven, into it at some point in the future; that way, the solar collectors would not be mounted or affixed to the modular panel, but would rather be an integral part of the panel and/or its covering material(s) from the very beginning. The panel of the present invention may also be useful as a sound-absorbing panel or a new type of acoustic panel to be installed in or around facilities of many kinds. According to the article "Acoustics: Absorb, Block, and Cover," by Jana J. Madsen of Building Magazine (found on the interne at www.buildings.com/Articles/detailBuldings.asp?ArticleID=3182 and accessed on Jul. 25, 2006) materials that are lightweight and porous are good choices for trying to control noise levels in facilities. The panels of the present invention may thus serve to absorb, help block or deflect unwanted noises in/around a home, a school building or workplace. The panels of the present invention can also be useful as a means of screening flying embers or sparks from getting to a rooftop in an area prone to wildfires.

The following applications for the panel of the present invention's use in various industries are examples of the most likely uses, but should not be considered all-inclusive.

Building Construction:

This panel may be used as an improved interior or exterior insulating panel (for example, over roofs, rooftop equipment, walls, parking spaces, walkways, pool/spa covers, patio/deck covers, carports adjacent of homes/businesses, motor home or boat shelters, etc., or inside attic spaces, wall cavities, ceilings, around ductwork, garages, workshop spaces, barns and/or sheds). The panel of the present invention can also be used as a new alternative to traditional tents, canopies, and/or other types of shelters; and it can be added to most existing types of tents or canopies to make them even more effective and/or durable. The panel of the present invention may be used to help reduce noise levels in/around buildings, as mentioned above. The panel of the present invention may be used as a protective panel for skylights. Various amounts of natural light can pass through the panel of the present invention depending upon the exact type of lightweight, low-density material that is selected for the panel's "tube" or "pocket" (its covering). The panels of the present invention provide twice the shade, wind, and hail protection for skylights than any previously-existing technology or option. This new panel may be used in conjunction with "green roofs" or rooftop gardens. Rooftop gardens are most prevalent in mild climates and are left open to the sky; however in hot climates, this may cause the planted vegetation to endure too much heat and water consumption. The panels herein described, again, provide twice the amount of shade, wind and hail protection than any previously-existing technology or option. By filtering sunlight and its associated heat, these panels can help the soil or other planting media retain moisture longer, thus conserving water. The panels of the present invention can be used as an uppermost, protective covering for existing, traditional roofing materials (including paints or coatings that may crack, peel, blister or warp under the stress of direct solar insolation) and/or rubber roofs, tar-and-gravel roofs, metal roofing that contains fasteners that become worn-out over time due to heat from the sun causing expansion and contraction of the metal sheets). The panels of the present invention may also serve to protect shingles and certain types of tile roofing products, as well. Roof-life extension can be provided by the panels of the present invention by significantly helping to stabilize the temperature of the traditional roofing materials; in fact, they may serve to double to triple the normally-expected service life of such products. According to the (U.S.) White Coatings Council's report on roof durability, a "rule of thumb" for thermal aging of roof materials is that for every eighteen degrees of temperature rise (above ambient) on rooftops, the roofing system's life is cut in half. The unique panels describe herein easily and cost-effectively help significantly reduce thermal aging due to temperature rise. The report, "White Coatings Council: Lowering Temperatures Greatly Enhances Roof Longevity," was accessed on the interne at www.buildings.com/articles/detail.asp?ArticleID=3206 on Jul. 24, 2006. Temperatures on many traditional roofing materials, under bright, sunny conditions, have been measured at seventy to one-hundred degrees F. above the ambient air temperature. The panels of the present invention can lower surface temperature on these materials to ambient, and/or slightly below ambient. Each panel of the present invention creates an instantly-cool environment for traditional roofing products as soon as it is in place. It is important to note that the panels of the present invention are not expressly intended to replace any such traditional roofing product, but rather to protect them along with providing valuable benefits to the building owner such as energy-savings and improved comfort level for occupants. Water passes through the panels of the present invention; therefore a need still exists for traditional roofing products to serve as a water-tight membrane for the buildings. With the panels of the present invention in place, rainwater is shed from the rooftop just the way it would if these new panels were not there. The panels of the present invention do not create a problem due to water "ponding;" and in most instances, they have been, and will be, installed very close to the traditional, existing roof surface. Adequate access to any equipment is maintained, and walkpaths (narrow pathways leading form the edge of roof out to equipment installed on the roof, such as HVAC equipment) are provided where necessary; however actually walking on/across the panels of the present invention is normally not a problem. The panels of the present invention may also provide protection to wall systems/facades wherever desired. They may help protect siding from hail impacts, and they may serve as improved, two-sided awnings, overhangs, louvers or any other exterior shading device. This will keep windows and/or other "glazed" areas considerable cooler than currently available awnings, overhangs, louvers or solarscreen window panels. The panels of the present invention provide twice the shading capacity as any currently-available option. Many applications within the field of architecture are possible for these new panels, and they represent unique, multi-purpose protection options for many types of building envelopes. The panels of the present invention may be designed (or retrofitted) to any building to help hold heated or cooled air inside a building if/when power outages occur. Design for Survivability is what architects are calling the effort to make buildings more inhabitable if, for example, a natural disaster has occurred and people are having to "shelter-in-place." Often, electricity supplies are disrupted. Buildings may not have backup generators available; but even if backup generators are available, if the panels of the present invention are installed on/around the building, then the building is better equipped to withstand extreme heat or cold from the outside (thus making it more protective for occupants of the building and definitely more survivable). The panels of the present invention also serve as an improved method or strategy to further conserve energy and reduce electricity bills. Installation of the panels of the present invention allows building owners to slightly raise the thermostat setting in summer/warm months and/or to slightly lower thermostat settings in cold weather months of the year, thereby helping save energy and money that would be spent on electricity or other fuels. This raising or lowering of the thermostat settings is possible due to the blocking or deflecting of wind currents at selected areas on or around the facility. The panels of the present invention additionally serve as a method or strategy to help create "green," environmentally-friendly buildings that may receive "high-performance," "LEED" (Leadership in Energy and Environmental Design rating from the U.S. Green Building Council) and/or "Energy Star Building" designations. (Energy Star is a partnership program started by the US EPA and US DOE to help improve building energy performance, and it involves product manufacturers, also). The panels of the present invention, if/when water mist is applied, provide superior levels of cooling to the surface or surfaces they are protecting and do this with a much lower level of water use than any previously-used, described or invented shading system. Water droplets, when applied to the "underneath" side of the panel of the present invention (that side of the panel not in direct sunlight and shielded by an "upper" side of the panel which is in full sunlight), remain on the panel considerably longer (normally three to four times longer) than the amount of time water droplets are able to remain on an upper layer or side of the panel under hot weather conditions. For example, if an upper panel (or a single-layer shade panel alone) is misted for ten seconds, on a hot afternoon that panel may need to be re-misted at ten or fifteen minute intervals; but if the underneath layer of panel covering material is misted for the same length of time (ten seconds) the time between misting cycles can be stretched out to thirty to thirty-five minutes or even longer, depending upon how hot and/or windy it is at that location on that particular day. Thus, the panel of the present invention dramatically saves water over anything described in prior art. Finally, the panel described herein serves as a method or strategy to create carbon-reduction and/or other environmental credits or offsets. Saving energy use in buildings can lessen the amount of carbon dioxide released to the atmosphere by power plants. This is increasingly important as climate change reduction solutions are being discussed and are receiving more attention as the years go by. In widespread application, the panels of the present invention (along with other energy-saving and renewable energy devices, systems and products) can provide a significant role in helping to clean the air, to protect human health, to help lower the number of power plants that must be built, and to help slow down the rate of climate change/global warning.

Agricultural Applications:

The panels of the present invention can be used as new, improved panels for construction of greenhouses in the horticulture industry, and may be used as an added insulating panel anywhere on (but especially on the outside of) existing or traditional greenhouses. They may also be useful as improved housing and/or shelters for livestock such as cattle, or for populations of wildlife; and they may serve as wind-blocking panels for protecting plants, crops, animals or people from extreme cold/winter winds and as an improved impact-resistant panel to help protect all of the above from damage or injury in the event of extreme hailstorms. The panels of the present invention may also be used as permanent or temporary shade shelters for agricultural workers. A panel (or several panels connected together) could have wheels or skids attached to the bottom edges of them so that they would be made portable/moveable, towable or even self-propelled (so that they are capable of being easily relocated to other areas/sections of an agricultural field, for instance, as work progresses across the field). Alternatively, the panels of the present invention can be attached to (or mounted on) existing trailers thereby creating very cool, portable "cooling stations" for farm workers to take short breaks from the sun's heat. The panels of the present invention can also be used as a completely new means of protecting water supplies in agricultural, and other/applications. The panels described herein can be useful for water holding/storage areas (including water tanks), for water treatment facilities, and especially for irrigation/aqueduct channels. Much water is lost to evaporation throughout the hot summer months of the year, and the panels disclosed herein are exceptionally capable of helping slow and greatly reduce such evaporative water loss. The panels described herein are also useful within the agricultural community as a means/method of helping protect grain storage areas and/or wine/grape production/storage areas. These panels can help maintain a desired temperature range for these (and other) stored agricultural goods and products. Also, they can serve to provide valuable, extra insulation for meat processing facilities, dairies, refrigerated warehouses, etc. Another valuable use is for wood/lumber preservation. These panels help maintain proper humidity levels for optimum wood product storage, thereby helping prevent premature drying, cracking, or splitting of the cut lumber as often happens when wood/lumber is exposed to direct sunlight and too much heat. The hotter the environment around the lumber, the lower the humidity level and the more likely lumber is to crack or split or warp. The panels described herein can help reduce ambient temperature in and around wood product storage areas (at the same time increasing humidity levels) which is very beneficial for the shelf-life of lumber.

Another use for the panels of the present invention is in the area of erosion-control. Anywhere on a farm or ranch (or in areas where highway construction or expansion is taking place) where there is a need to control soil erosion, the panels described herein can be utilized. "Silt Fence" products are routinely used in these areas, and they consist of a single layer of heavy-duty "Geotextile" material, usually black, attached to one side only of wooden ground stakes. The lower portion of each stake, being pointed, is pounded into the ground and spaced wide enough so that the geotextile material is stretched between them and supported, with the bottom of the geotextile material being at ground level. The panels of the present invention (due to the fact that they are double-sided, can be formed using two or more layers on one or both sides, and due to the fact that water will pass through the panels' covering materials in most cases) provide a superior "silt fence" product. Additionally, when used as a silt fence solution, the lower portion of the panel of the present invention should be installed slightly below-grade rather than simply resting upon the ground. This will improve the erosion-control capacity considerably. Panels for this application can be made in any height and length suitable for the job; but an exemplary dimension may be two feet high by ten feet long. In this example, the panel's lower 6 to 12 inches should be installed below ground level; and the soil replaced will serve to hold the panel(s) in place, possibly avoiding the need to have additional ground stakes. Stakes of wood, or other suitable materials, can still be used to reinforce these new silt fence panels; and the panels are easy to handle and ship/transport to a jobsite or to any area needed on a farm or ranch.

Another way the panels of the present invention can be especially useful in an agricultural setting is for protecting colonies of bees. Beehives can have the panels of the present invention attached to them, on any or all sides, and/or be installed in such a way that they provide temperature-control to several beehives at once. Panel "tubes" or "pockets" can be selected that are sufficiently "open" enough in their weave so that the bees are able to pass through to the hive; or, alternatively, small holes, slits or any other type of opening can be made into the panels of the present invention to allow the bees to reach the hive(s). One side of each panel could consist of traditional, commercially available "hail netting" which has quite a bit of room between the strands of the netting; then the other side of the panel could be made of commercially available shade fabric (with gaps, holes or slits fabricated into it to allow bees easy access to the hive). There is presently great concern about declining bee populations here (and possibly in other areas of the world, too); thus the panels of the present invention might be able to help protect and conserve bee populations by providing much needed shade and temperature control (and wind-blockage or wind-deflection as well wherever needed in areas that bees inhabit).

Further use in farm and ranch applications lies in the panel of the present invention serving to help protect and conserve fuel supplies. These unique panels provide an entirely new means of shielding fuel tanks from excessive heat gain (in summer months) and to help stop fuel evaporative losses no matter what season. The panels of the present invention provide twice the shading and wind-protection to fuel supplies than any previously-existing or described technology or product. Currently-existing (and recommended) fuel tank storage shelters (being constructed of materials that are much denser, opaque, or both) are not as effective at protecting fuel tanks and their contents from unwanted heat gain. Used in cold weather months, also, the panels of the present invention can help block cold northerly winds, help prevent frost and ice formation on the tanks, etc., that the fuel storage tanks would otherwise endure if left exposed to the elements. This can play a role in helping maintain the structural integrity of the tank or storage vessel/container.

These new panels are especially effective where single-walled, above-ground fuel storage tanks are concerned, and they help to significantly reduce or to "narrow" the diurnal "swing" in fuel temperature, thereby helping save valuable product and reduce "standing loss" (or breathing loss) emissions to the atmosphere from uncontrolled or unprotected storage tanks/vessels. Prototype panels of the panel of the present invention have been constructed and put in place around single-walled barrels holding unleaded gasoline (both painted bright white and oriented the same direction on the same property; one left open to the elements and one protected by the panels of the present invention—a parallel-type of test/demonstration), and there have been significant gasoline surface temperature differences observed and recorded between the unprotected fuel container (open to the sky) and the barrel surrounded and protected by the panels of the present invention. Saving fuel helps the economic situation of farmers/ranchers while at the same time helping protect and extend our fuel supplies on a state and national level, thereby helping to contribute to our energy security.

Industrial Applications:

The panels described herein have various uses in industrial/manufacturing settings. They may be used to help improve industrial organic and/or inorganic product storage. They may be used in summer or winter as desired to provide added insulation and protection to many, many types of storage vessels. Single-walled, fixed-roof storage tanks are projected to significantly benefit from use of the panels of the present invention since heat from the sun can cause considerable losses to occur, particularly if such single-walled tanks are holding a high vapor pressure substance. By helping reduce or even eliminate the amount of solar insolation and heat that is able to even reach the storage tank, valuable product can be saved and the local environment can be improved. Because the panels of the present invention are highly-insulating and lightweight (yet very strong, durable and easy to handle and install), they serve as a great improvement over any other type of shading strategy or invention for storage tanks (especially above-ground storage tanks and/or mobile storage tanks of various types) such as the type of pollution-control, product saving shade structure described and disclosed in Forbis et al U.S. Pat. No. 7,246,468 B2. The panels of the present invention do not have the drawbacks of trying to attach any type of cables and/or heat-insulating blocks to a storage tank, having to deal with the time-consuming process of attaching a multitude of shade fabric "clips" around cables and onto strips or sections of shade material, etc. The panel of the present invention can have an interior framework that is a little more flexible, if needed or desired, so that, for instance, the finished panel may be slightly bent or curved to match the curvature of a storage tank. As many of these slightly flexible, modular panels as needed may then be joined together and installed around the circumference of the storage tank/vessel and/or over its top. The panels may come into contact with the walls or roof of a storage tank or may be completely stood off from the exterior of the tank(s). This capability greatly enhances the usefulness of the present invention in regard to protecting storage tanks, whether they are stationary or mobile. Additionally, the panels of the present invention may be used on/around floating roof aboveground storage tanks to block wind currents, thereby helping to stop (or greatly reduce) wind-related losses of product. Panels of the present invention, again due to their lightweight, yet strong, nature—along with the number of variations in the dimensions of the finished, ready-to-install panel(s)—can be constructed to attach to and surround the upper portions only of such floating roof tanks (for instance, around the top, "rim" area only) so that crosswind currents are effectively blocked at that level only. Alternatively, the wind-blocking panels of the present invention may be taller and sized to cover the entire side (or sides) of the tank and to extend above and beyond the top of the tank for wind/blocking and deflecting purposes. The panels may extend straight upwards or be bent or positioned at any angle desired to achieve effective blockage of wind currents. Another industrial use for the panels of the present invention is to use them to add another level or layer of insulation to heated storage tanks. These tanks also, depending upon their location and the climatic conditions they experience, may benefit from the wind-blocking capabilities of the panels of the present invention. In addition to heated storage tanks/vessels, refrigerated storage tanks and containers at industrial locations may also benefit from use of the panels of the present invention. In fact, some substances being stored at low temperatures may become very unstable, and possibly explosive, if subjected to suddenly-rising temperatures. Such a situation may occur if a power outage takes place at the plant or in case certain equipment were to fail. The panels of the present invention, if installed in an operable position around these types of storage tanks/vessels to help prevent solar heat gain, could help provide valuable minutes for plant operators to restore electrical power, to install back-up generators or to take other measures to get the situation under control. This application for the panels of the present invention definitely serves as a safety measure for helping protect life and property simply by shielding such tanks from exposure to unwanted or undesired heat from the sun especially if, as detailed above, there happened to be an unexpected power failure at the plant.

Further industrial/manufacturing uses follow, but should not be considered to be all-inclusive: These innovative panels may be used as corrosion-reduction panels anywhere desired in/around an industrial plant. This is because the panels of the present invention effectively shield objects from the normal forces in the environment that cause degradation of materials (i.e. too much heat, the sun's direct UV rays, heavy "driving" rainfall, ice and sleet, hailstones, blowing sand, dust, dirt or any other debris that would normally impact the objects being protected/shielded if the panels of the present invention were not in place to protect them and reduce the likelihood of damage to those objects). These new panels will be especially helpful in the protection of pipelines; again as an inhibitor to corrosive forces, either natural or other hazards such as certain potentially-corrosive chemicals that could blow or drift onto such pipelines if left uncovered/unprotected. The panels can be made long and narrow, for instance, to more readily conform to normal pipeline configurations, and can be joined together to cover the entire pipeline (or any particular expanse desired) either inside or outside of an industrial plant's boundaries.

Additionally, the panels of the present invention could be used to help protect, and shield from unwanted solar heat gain, industrial equipment "enclosures" or "equipment houses". These are most often air conditioned, and use of the panels of the present invention around them could allow smaller air conditioning units to be installed/used and still accomplish the desired/needed level of cooling. The panels described herein can be installed to protect the walls only of such enclosures (especially a west-facing wall that absorbs great amounts of heat from the sun during warm weather conditions) and they can be used to shield the top of the enclosure only or completely surround the enclosure, effectively putting the enclosure "in the dark". This should significantly help maintain the desired temperature range for the enclosed equipment. In some locations or climate zones, the use of air conditioning equipment may then be optional.

The panels of the present invention may also be able to add extra protection/insulation for boilers and/or combustion units wherever effective, desired and feasible. The panels described herein can help block heat loss from such units, and adequate access by workers can always be designed and allowed for if utilized for this, and other, purposes. Additionally, the panels of the present invention can be used to enhance the effectiveness of chiller units, ice-making equipment and/or cooling towers by keeping excess heat from reaching the units and (in the case of cooling towers in industrial settings) by keeping cooling tower water from blowing/drifting out of the tower. The inner layer of fabric/material of the panel of the present invention becomes another surface on which heat exchange/transfer may take place, while the outer layer/side of the panel continues to screen out harmful heat from the sun, to keep windblown debris from entering the tower, to keep birds and/or other wildlife from entering the tower, etc. This can definitely help maintain the cooling tower at its optimum working condition, help reduce maintenance and repair costs, etc. This innovative double-sided, protective shade panel of the present invention (with desirable air space between the two sides) will perform much better for enhancing cooling tower performance than any existing or previously-described method, strategy or technology (including that which was earlier described, and submitted as a provisional U.S. utility patent application, by the inventors of this presently-disclosed, unique, modular panel and which is still U.S. patent pending).

The panels of the present invention can very cost-effectively create a much "cooler" cooling tower (and/or chiller or compressor units) thereby increasing its efficiency and effectiveness as part of the heat exchange process. The cooler the overall tower or chiller or ice-making equipment can become, the better it can be at performing its intended function. The panels described herein can also be used to cover "make up" water areas, serving to keep the water itself considerably cooler during hot weather conditions than it would be otherwise. Shielding make-up water areas from direct solar insolation can help conserve water as detailed above in the agricultural applications section of this specification; and the panels of the present invention may be attached or affixed to any type of floatation device or structure as needed to enable them to be positioned properly slightly above or over the water supply. Alternatively, the panels (when/if used in such an application) might be constructed in long enough dimensions to effectively reach across the water to the other side, and could even be attached to any type of truss or beam that would allow the water supply to be sufficiently "spanned". Still referring to use of the panels of the present invention in cooling tower applications, there is also the possibility that they could actually help lower the make-up water temperature so effectively that much more heat could be removed from the hot, incoming water, and that it could happen much more quickly. This cooling tower efficiency improvement can help the overall operation of the plant by speeding up the cooling process to a certain degree. This can serve as an economic advantage (for the users of this unique, modular panel of the present invention) over competitors in industry that do not incorporate this solution into their operations. Additionally, the panels of the present invention can be useful in blocking external heat from the sun that would normally reach distillation towers in refineries. Much cooler distillation towers could greatly assist in timely product separation/formation. This, too, would be a significant economic advantage to users of the panels of the present invention for this purpose. The panels described herein may also be used along industrial "fencelines" (or boundaries) as a windbreak and/or as a chemical drift-control barrier system. Alternatively, they may be used in these areas simply as a physical and/or visual barrier or screen. Panels can be built to any desired height, utilizing any desired framework that is sufficiently strong enough to hold up to industrial expectations/standards, and they may be supported by various means and materials. These new, innovative panels can also be useful as windbreak panels and/or as temperature moderation/control panels for onshore and offshore drilling operations/areas. This panel can be a worker protection and safety product by blocking (or helping to block) extreme winds and, thus, can help in preventing workers from being blown off rigs or platforms. The panels of the present invention can also be useful for creating more moderate working temperatures and conditions for employees, thereby assisting efforts to improve their health and safety. The panels of the present invention can also be used to surround (either completely or partially) oil storage tank "batteries", pumper units and compressor units at these locations. Tank "batteries" have not been shaded/protected from the sun's light and heat before, and they will be able to retain more of their stored product if the panels of the present invention can be installed in an operative position around them. They need not be installed around each tank within such a tank battery, but rather (since they are often in close proximity one to another) several tanks within the "battery" could be covered and protected by a single, larger modular panel of the present invention. In some cases, all of the tanks at such a "battery" can be shaded and protected by a single shade structure that is made up of one or more of the panels of the present invention. Additionally, at any type of oil-drilling location where housing is provided for workers and/or where temporary offices are put in place (such as trailers, mobile homes and/or modular buildings), the panels described herein can help keep them much more comfortable whether they have air-conditioning/heating systems, evaporative cooling units, fans (or any other means of providing comfort and temperature control) or whether they do not have this equipment.

Providing benefits relating to fall-protection can be another function/use of the panels of the present invention in many areas, including industrial areas. They may be attached or affixed firmly and securely to any existing beam or scaffold where fall-protection is desired, thus serving as a new type of safety barrier system. This will be very useful for companies with workers who must carry out their duties at locations high above ground-level (either at industrial plants OR for workers in construction such as high-rise office building contractors, window washers, rooftop workers/repairmen who must get onto roofs no matter what the height, etc.). The panels of the present invention can be attached very securely to high walkways, scaffolding, roof parapet walls and other existing places where workers go in order to add an extra measure of protection against accidental falls. Even though regulations require measures such as ropes, cables and worker harnesses to be worn, the panels of the present invention can serve as a back-up strategy in case the other, normally-used equipment were to break or fail. Such innovative, modular, fall-protection panels are strong, lightweight and easy to install and to take down as needed. They can be easily re-used and moved to other locations. It is possible that company insurance rates might be able to be lowered somewhat for firms that would employ this additional method of worker safety-barrier. Actually, the panels of the present invention can be used anywhere in or around an industrial plant to keep it cooler for workers and/or equipment, to help protect against accidental falls, to help protect workers in certain high-risk areas from being hit and possibly injured by any debris that might come loose from a nearby area of the plant and suddenly come flying their direction (the panels described herein thus serving simply as an impact barrier), and/or as noise-reduction panels, wind-break panels, water-screening panels and/or dust-control panels.

As described in the agricultural applications section of this specification, water will (or may) pass through the panels of the present invention, thus they may be useful as an alternative means of "screening" out unwanted debris or particles from a water stream. Additionally, the panels of the present invention may be useful within industrial and/or manufacturing areas by aiding in dust control. This would be especially true if these new panels were installed anywhere that drifting of dust is a concern. The panels of the present invention can serve as easy to build and install (and very easy to maintain) dust-collection panels, particularly if they are moistened with droplets of water or any other type of substance that could be sprayed, misted or applied to the surface or surfaces of these new panels. If utilized as such a new type of dust control "screen" (or filtering or collection device), the panels of the present invention may be cleaned periodically by simply spraying with a water hose (with little or no shaking or scraping needed). Again, because these new panels (in an exemplary embodiment) are double-sided, with valuable air space in the center of each panel, they are capable of "screening" more particulate matter that all or most other available options. (For example, whatever particles may make it through the first, or outer, side of the panel could be "caught" by the material on the other side of the panel, especially if the panel covering tube—or pocket—were designed and fabricated to have a material on that side that is more tightly knitted or woven than the material that makes up the other side of the panel.) In this application, the panels of the present invention can assist a community or region with efforts to reduce particulate matter (PM) particles in the atmosphere; therefore additional environmental credits and/or incentives may be able to be obtained.

A further use for the panels of the present invention (which encompasses not only the areas of industrial/manufacturing but the agricultural industry, as well) is for use at/around ethanol production and storage facilities. The panels of the present invention will help to significantly protect ethanol supplies and/or fuel mixtures that contain ethanol (such as E-85) from evaporative losses due to heating by the sun (and/or from wind-related losses of product). Buildings (especially those not having much existing insulation), sheds and other types of shelters in these areas may also benefit from use of the panels of the present invention.

Civil Engineering Applications:

The panels of the present invention can be used on or near bridges or overpasses where traffic moves to help block or deflect high winds that can cause drivers to lose control of their vehicles. High profile vehicles are often blown over when navigating across bridges and overpasses by strong winds, and the panels of the present invention may be used as very effective wind-blocking panels to help protect drivers from encountering such dangerous winds. These innovative, durable, modular panels may be attached to any type of beam or support structure as may be required; and in the case of attaching to bridges, these panels can make use of the beams that are already a part of the bridge, thus adding additional support beams to hold our panels (which would add more weight to the bridge) would not be necessary in most cases. New bridges and overpasses can be designed and engineered with the panels of the present invention in mind (from the very beginning of the project) to allow for any type of support attachment device or systems that would be needed or required.

The panels described herein can be used near aircraft runways (especially for those used by general aviation and small aircraft and/or helicopters) to help block crosswinds that can cause trouble for pilots when taking off or landing. The panels of the present invention can be made however tall and however wide they need to be to accomplish this (and, again, they can have support mechanisms that are sufficiently engineered to securely hold them in place under all, or most, environmental conditions).

The panels of the present invention can also help protect bridge support columns, wherever feasible, from impacts by small watercraft and/or barges. In the past, barges have crashed into bridge supports and have caused considerable damage under stormy and/or windy conditions.

If the panels of the present invention were in place to help shield and protect the bridge support columns (and due to the slight "give" and stretchability of the panel coverings of this new panel), those support columns could be shielded and protected by one or more of the panels of the present invention. The panels would themselves receive most of the force from the impact, and even if some damage were to occur to such protected bridge support columns, the damage would be less than if the panels described herein were not present serving as a barrier around them. The panels of the present invention can be spaced at any reasonable distance away from the bridge support column(s) as needed. Additionally, if the panels of the present invention were in place to help protect bridge support columns or posts from accidental impact, another benefit might occur. The panels of the present invention, when installed securely and permanently, could help protect such bridge support structures from strong wave action and the erosion or deterioration that can cause to said bridge support structures. These new panels, in an operative position, can help slow down (and deflect, to a certain extent) the force of strong waves, thereby helping preserve the service life of bridge and/or overpass support columns over rivers, lakes, canals and other waterways.

Another use for the panels of the present invention is in constructing outdoor pavilions, gazebos, auto-racing facilities, sports stadiums/complexes, etc. The panels of the present invention would be especially helpful if put in place around sports stadium "sky boxes" and/or enclosed areas designed for media reporters/announcers. These are normally located very high in the stadium, to provide excellent views of all that is taking place on the field below, and they receive lots of direct sunshine as well as strong wind currents (as wind speeds increase with height). The panels of the present invention can serve to help shield and protect sky boxes and other enclosed areas of a sports complex thus making them much more comfortable for occupants.

Additionally, the panels of the present invention can be useful as a new type of highway sign and/or outdoor billboard. These double-sided panels can provide a lightweight, strong, non-glare producing surface on which to print motorist warnings/messages and/or advertising. Because the "tube" or "pocket" panel covering materials can be porous in nature, not as much wind load would have to be allowed for, thereby allowing for less heavy support poles or beams on which to install them (which saves natural resources).

The panels of the present invention can be used in areas that are experiencing loss of ice and/or the melting of permafrost. These innovative panels provide excellent insulating capacity, so their usefulness in these applications could be important. Single sheets of non-porous/non-permeable white plastic have been stretched over the end of a glacier before (in Switzerland, per a report found on the internet) to try to stop its melting; but the panels described herein (when constructed of many different colors) have many advantages over using a single layer (or even more layers) of that white non-porous plastic (which is likely to be whipped about by the wind and damaged, and which does not have nearly the insulating capabilities of the presently-described modular panels).

A similar project was undertaken in Greenland, also (using large sheets of white plastic held down by large wooden beams) in an attempt to try to slow down the loss of ice. Wood heats up in direct sunlight, so it is possible that the heat from the large wooden beams used would still transfer to the ice that the white plastic sheeting is trying to protect and save. Again, the panels of the present invention would be a more effective ice-preservation alternative.

At the other extreme of climatic conditions, the panels of the present invention may be useful to help create much more moderate temperatures for humans and/or for wildlife in desert areas. Use of the panels of the present invention, in any configuration desired, can also help to lessen the likelihood of dust storm initiation. Severe dust storms and sand storms are often begun due to the extreme heating of the desert caused by intense, relentless sunlight; and then these sand and dust storms have devastating impacts on nearby populated areas. Along with being a health hazard to humans, they cause a great deal of damage to property. The panels of the present invention may be able to assist in the reduction of some of these sand/dust storms (or at least to provide dust and/or sand "screening" panels to block large amounts of sand and/or dust from reaching certain cities, villages, wildlife habitats/zoos, to protect equipment that must remain outdoors, etc.).

An additional use for the panels of the present invention is attaching them to handrails that are part of lift platforms and certain types of industrial ladders and/or to carts and industrial "wagons" used to move supplies. Having the panels of the present invention installed to "close in" presently open sides of these handrails and platforms can further increase their effectiveness and safety. For instance, items or tools (if accidently dropped by the person or persons handling them when atop such ladders or lifts) could fall through the open spaces between the metal railings, thereby possibly striking people working at ground level nearby. The panels of the present invention, even if installed on only one side of a ladder or platform where this could occur, can stop the item or tools from falling off the platform. Regarding their application for various types of carts and wagons, the addition of the panels described herein can also help keep items being moved exactly where they belong. (This would be also helpful in regard to hold luggage carts known as Bellman carts, even if the panels of the present invention were only installed on the more narrow open ends of these carts, leaving the larger open ends to remain open as they are now.) Any type of utility cart, "stock" and/or "order-picking" cart (as used in warehouses) and/or any type of wheeled cart, wagon or trailer used at the site of a large outdoor construction project may benefit from the use of the panels of the present invention. Many types of fork-lifts have one section of metal screening to help protect a person on its platform from coming in contact with the mast; and the panels of the present invention could be used as an alternative, lighter-weight option for such a screen. Many types of commercially-available carts, lifts and wagons and scaffolding may be found at www.globalindustrial.com and by searching for other industrial supply companies.

The catalog for Global Industrial can be obtained by contacting the company at 2505 Mill Center Parkway, Suite 100, Dept. DL2, Buford, Ga. 30518-3700. The panels of the present invention can, thus, be used for additional fall-protection, not only around scaffolding at construction and/or civil engineering projects, but also for creating improved carts, wagons and lifts that will help keep people and/or tools from falling off them. They can be brightly-colored to catch the eye.

Renewable Energy Systems:

The panels of the present invention may be used in the area of renewable energy, as mentioned earlier in this specification. New solutions for providing energy (and/or for helping existing renewable energy systems perform more efficiently) are needed; and the panels of the present invention can help. They may be used as wind-deflection or concentrating panels to help improve performance and output of wind farms (primarily onshore, but possibly offshore as well). The panels of the present invention can be strategically placed, and securely supported, wherever needed in the vicinity of wind farms to help increase wind speeds approaching the wind turbines that are generating electricity. This may help more power to be generated, even on not-so-windy days, than the amount of power that is currently able to be produced. The presently-described, innovative panels may be made as high and/or as wide as needed (and made from any color so as not to detract from the natural surroundings such as green—to blend in with grass-covered low hills or meadows—or even blue to blend in with the clear, summer sky). They may be placed so that they help gather, and increase the speed of, the wind to selected wind-generating equipment within a wind farm only (not all).

Additionally, the panels of the present invention can be used as a new "base" material for solar panels. Existing types of solar collectors may be attached or affixed to the panels of the present invention (as described earlier in this specification). Thin, flexible solar-collecting tubes may also be incorporated into the panel of the present invention. Solar cells and collectors of many types may be able to be applied to the panel of the present invention, and the completed panels may be free-standing. They may also be attached to new or existing buildings to generate energy for use within the building while at the same time helping to protect the building's envelope from hail, extreme winds and harsh sunlight. BIPV—Building-Integrated PhotoVoltaics—is an important field of endeavor in which solar cells/collectors and/or panels are designed into (and incorporated with) a building from the very beginning of the project. The panels of the present invention are especially suited to be utilized within this field of BIPV. As noted earlier, finished solar panels of the present invention may have solar collectors on one, or both, sides; and they may be installed on rooftops so that sunlight is received by one side of the panel virtually all hours of the day. They may be installed in a flat or horizontal way (for instance, slightly above and parallel to a flat-roof surface); and they may be also installed along walls of buildings, walkways and parking areas (as well as being used as a new type of solar electric overhang, awning, solar screen, entryway, "canopy", shading device for glass "sunrooms" in hot months. etc.). They can also be used to shade and cool balconies (such as those on high-rise hotels and/or multifamily/apartment buildings) while, at the same time, providing some electricity to be used within the building itself.

Extra electricity produced can often be supplied back to the utility company's grid so they may send it to other customers, especially at times of peak demand (which most often corresponds with the hottest, or coldest, times of the day and months of the year). Additionally, the panels of the present invention can be used, alone or in combination with mechanical cooling equipment, at truck stops, highway rest steps, truck loading areas, etc., in order to provide an environment conducive to allowing truck drivers to turn off their engines, thus avoiding "idling" emissions. The panels described herein, even without PV/solar collectors incorporated, can provide enough of a comfortable environment for trucks to park under (allowing them to avoid running the air conditioning unit of their trucks) in many moderate climate zones; but in very hot, sunny climate zones, the panels of the present invention with the solar collector components added can be very helpful in that they not only help provide a cool, shady place for truckers to park when they need to take meal breaks and rest breaks, but these new panels can provide some, or all, of the electricity needed to run cooling equipment (while greatly lowering intake air temperature and increasing its efficiency)! Smaller air conditioning units may be able to be specified to provide the desired level of cooling with the panels of the present invention in place. Another possible use for the panels of the present invention is within space programs. Photovoltaic systems are used on the international space station; and these new panels may be able to be installed there at some point in the future and/or be used to shade/cool and provide power from the sun for communications satellites that orbit the earth. The panels of the present invention, since they are lightweight and highly-insulating (and especially if they can be made in such a way as to be even more easily transported and assembled) could serve as solar electric/solar control solutions. They could even be used as windbreak panels to help protect equipment and/or people who may some day inhabit Mars (which has severe windstorms).

Exemplary embodiments, though not the only embodiments, of the present invention and their advantages are best understood by reference to FIGS I through II, where like numbers are used to indicate like and corresponding features.

Referring to FIG. 1, a frame is constructed of any suitable material. This frame is the first step in constructing the panel of the present invention, and it may be cross-braced for extra support or not. This drawing shows a bent frame, the type of which is commonly made for construction of metal gates. Other materials, rigid or somewhat flexible, may be used to construct this frame. The outer or main section of the frame is represented by the number 6, and the optional cross-bracing is represented by the number 7. Materials chosen for the frame may include galvanized steel, aluminum, PVC, fiberglass, wood or and other suitable material. The frame may be rounded or curved, alternatively it may be in the shape of "square tubing", rectangular or any other desired shape. Preferably, it should have a smooth surface so that the "tube" or "pocket" covering of the panel of the present invention may be easily pulled over it if made of galvanized steel, the frame may be powder-coated if desired or needed, especially if the completed panels are going to be installed in coastal areas. Frame materials may be chosen based upon locally-available materials, climatic conditions and/or other considerations especially the needs and preferences of the customer or user of these new panels. As discussed earlier in the specification, a frame that is a little more flexible may be desirable if, for example, it is needed to enable the finished panel to bend slightly to conform to, or to "follow" the curvature of the object or structure it is being installed to help protect. This may be for structural, or simply for aesthetic, reasons. Another feature of any frame for the panel of the present invention is that it may be made to be a folding of collapsible frame so that ease of shipping/transport may be enhanced and/or for use in certain types of applications where such a frame preferred. The frame, if made to be collapsible, or one that is capable of folding, ideally will be easily "locked" into the proper, full-length position before the panel covering "tube" or "pocket" is pulled over it. Additionally, since the panels of the present invention have many applications, are very durable and reusable, ideally any such collapsible or folding frame will be easily returned to the collapsed or folded position when necessary if the user of these new panels desires them to be moved to another area of the facility and reinstalled or for any other reason. The frame could be made to collapse or fold after removing the panel covering(s) only; but it should also be very easily-designed to be folded (in one or more locations or points around the frame's perimeter) so that this can be accomplished with the panel covering(s) still in place since all, or at least most, panel covering "tubes" or "pockets" will continue to be made from stretchy materials. A folding and/or collapsible frame is only an optimal feature of the panel of the present invention (not shown in FIG. 1); however, it may become a preferred framework in some applications.

Figure 2:
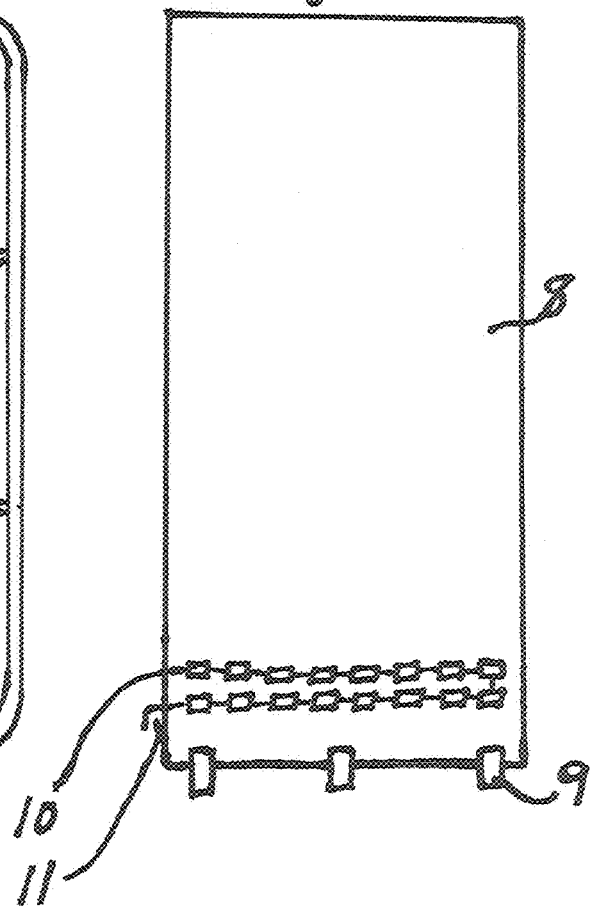
FIG. 2 illustrates a complete panel—one in which the frame has been covered completely by the lightweight fabric/material "tube" or "pocket"—and which illustrates optional solar collectors attached to a portion of the panel. Hook and loop fastener strips are also illustrated for fastening an open end (of the tube, in this example) where the frame had been inserted.

Referring to FIG. 2, a complete panel is shown which has the lightweight, low-density and highly-insulating material pocket (represented by the number 8) pulled over the frame, and perfectly self-tensioned. The frame (represented by numbers 6 and 7 in FIG. 1) is now hidden by the pocket (8) that has been pulled onto and over it. Many colors and types of materials are suitable to create the pocket shown, including knitted polyethylene "shade fabric" such as that available from Dewitt Company, Pak Unlimited, Farm Tek and others. Additionally, polypropylene shade fabrics, polyester shade fabrics, AlumiNet, and/or other lightweight, low-density materials capable of being sewn may be selected. The number 9 represents hook and loop fastener fasteners for the open end of the pocket to be closed and secured, following the insertion of the frame. Only one side of each hook and loop fastener is shown. The other corresponding hook and loop fastener piece would be on the other side of the panel, near the open edge and placed in a position so that when open edges of the panel covering are brought together and slightly overlapped, the hook and loop fastener pieces may be pressed together, thus securing the panel covering around the frame. Hook and loop fastener for outdoor use is available from Home Depot and many other companies. Number 10 represents solar collectors which have been affixed to a portion the panel's pocket/covering. These solar collectors are optional and may be utilized to produce electricity from the sun's light under suitable weather conditions. Several types of solar collectors are commercially-available and are suitable for incorporation into the panel of the present invention. All solar components selected will have been UL (Underwriter's Laboratory) approved. Number II represents the wiring that carries the DC electricity generated by the solar collectors to an inverter (not shown) for conversion to AC power.

Figure 3:
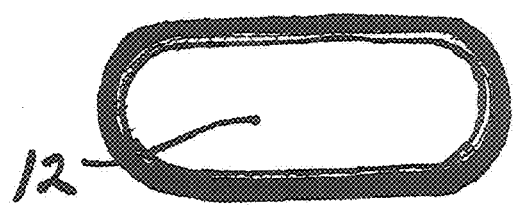
FIG. 3 illustrates an end view of a section of the fabric/material-surrounded frame with an air space in the center.

Referring to FIG. 3, Number 12 depicts the open air space that is created between the upper layer of panel covering material and the lower or underneath layer of panel covering material when the panel is fully assembled. It shows that "upper" and "lower" panel covering materials are uniformly spaced from one another and do not touch, sag or droop. This uniform, even air space is possible because the panel covering of the panel of the present invention perfectly "self-tensions" when it is pulled into place around the frame. The air space (12) remains when open ends or edges of the panel's "tube" or "pocket" covering are brought together, slightly overlapped and secured. This air space should not be considered "dead air space" since the panels of the present invention will, in most instances, utilize low-density, highly-insulating materials that are porous. The air within the air space is not completely "trapped" or sealed inside the panel but, rather, it is actually able to move or pass slowly through the panel covering. This characteristic of the panel of the present invention allows it to have good insulating capabilities. However, the interior air space could alternatively be replaced, if desired, with another lightweight insulating material suitable either for indoor or outdoor use. This could be a very lightweight foam product, strips or bits of recycled paper/cardboard, recycled plastic bags or strips, recycled strips of commercial shade fabric (such as scrap material that the manufacturers who make such shade fabric, or who fabricate products from it, must have hauled away), polyester fiberfill, Aerogel, or a plastic/air bubble product such as that normally called "bubble-wrap" (or any other suitable material with good insulating qualities). Naturally, any insulating materials that would deteriorate after getting wet would not be selected to be a part of the panels of the present invention designed for outdoor use. Filling up the air space of the panel of the present invention is not necessary at all in order for the panel to serve many, many valuable functions; however in some applications, utilizing one or more panel-filling substances in the interior portion of each panel could possibly enhance the performance of the panel described herein even further. As described above, the Number 12 in this drawing shows where the air space exists; and this would be the same location for any alternative insulating material that may, in certain instances, take its place in the center of the panel of the present invention.

Figure 4:
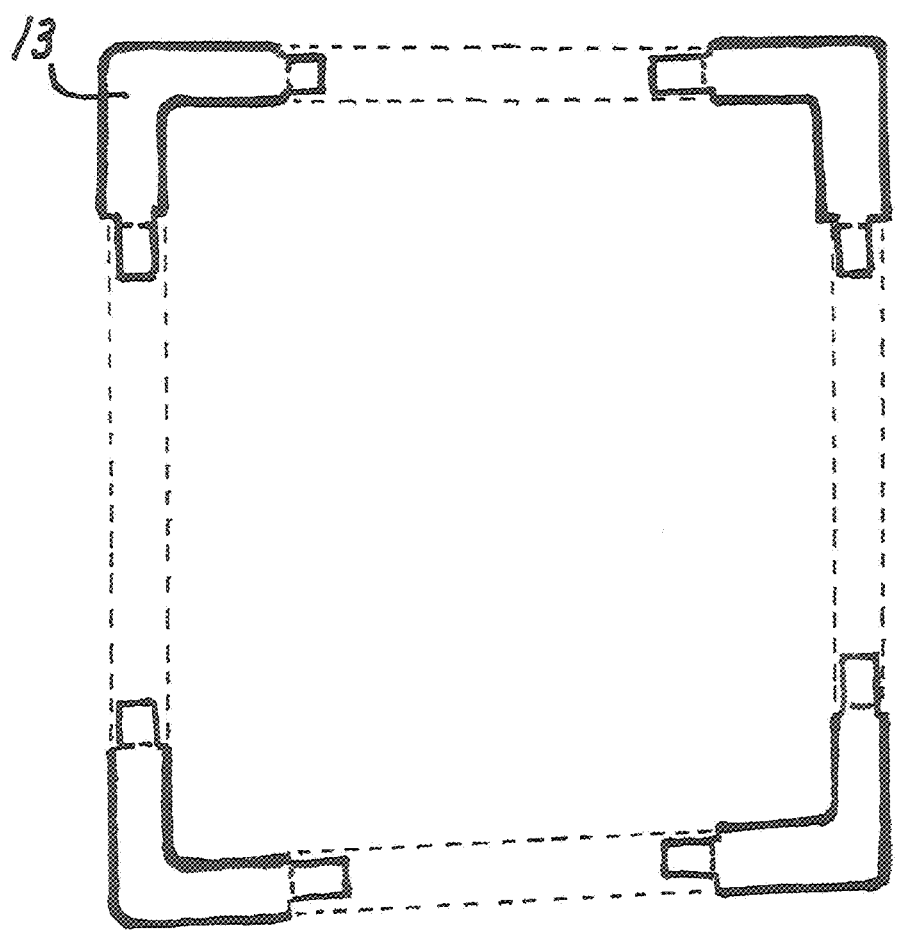
FIG. 4 illustrates bent and swedged corner components that may be used to construct a frame, along with side sections of tubing/framework that fit onto each end of the swedged corners.

Referring to FIG. 4, Number 13 represents a corner component that may be used to construct the panel of the present invention. Four such corner pieces are needed per panel, along with top, bottom and side segments of pipe or tubing (shown by dotted lines) that will complete the square or rectangular framework. This corner component may be made of any material that is strong enough to serve the purpose of holding the other (top, bottom and side) segments. These corner components have been made especially at the request of the inventors of the panel of the present invention and the prototype swedged corner components were made of galvanized steel tubing. PVC is also a good frame/corner component material since curved sections of the PVC exist for other uses and can be (and have been) adapted by the inventors of the panel of the present invention for the purpose of constructing other prototype sample frames. As described in the paragraph regarding FIG. 1, any other suitable material may be used for these corner components, including aluminum, fiberglass, wood, etc.

Figure 5:
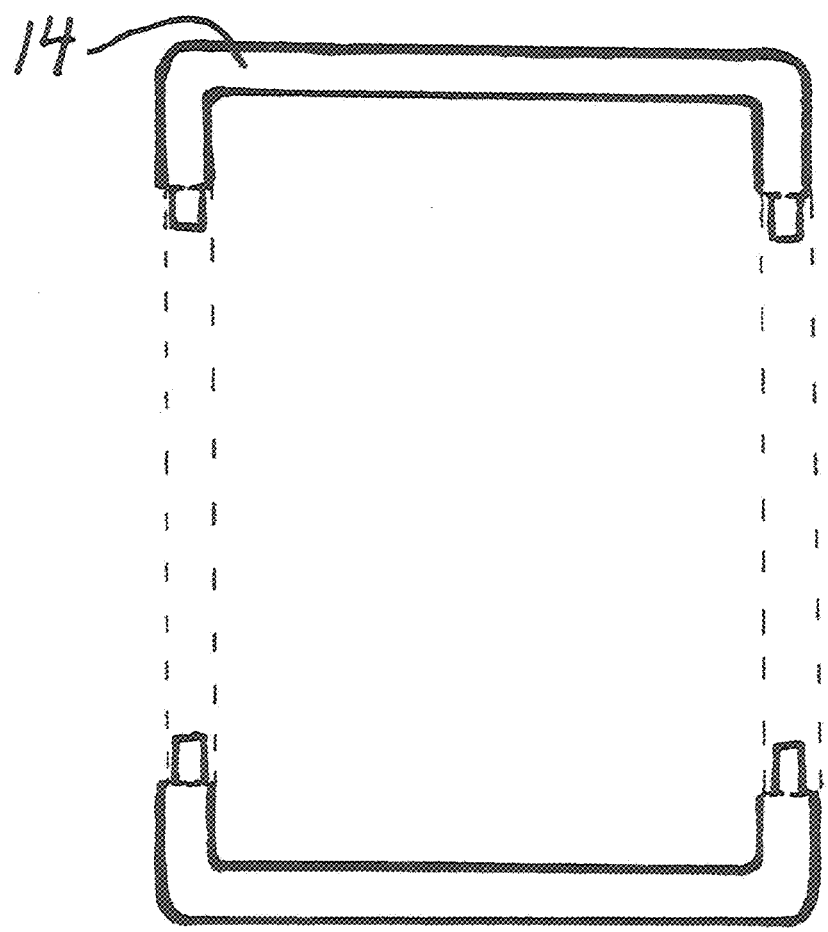
FIG. 5 illustrates U-shaped end pieces that may be used to construct a frame. These U-shaped components receive, and hold in place, the sections of tubing that make up the sides of the frame.

Referring to FIG. 5, Number 14 represents an elongated, U-shaped "end" component which may be used to construct the frame of the present invention. Two of these U-shaped end components are needed, along with "side" pieces or segments (shown by dotted lines) that the U-shaped end pieces will receive and attach to. This drawing shows an alternative means of constructing the frame of the present invention than the one represented in either FIG. 1 or 4. Number 14 may also be constructed or fabricated from any suitable material, although the most likely materials would be (as described regarding corner components, Number 13, detailed above) galvanized steel tubing or PVC, depending upon the application, location to be installed; but as discussed above regarding FIGS. 1 and 4, any other suitable material may be used for the U-shaped end components including aluminum, fiberglass, wood, etc.

Figure 6:
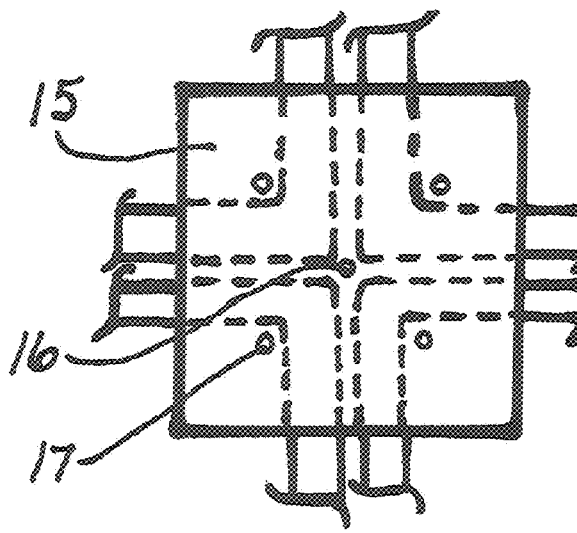
FIG. 6 illustrates a universal panel-connecting plate that has pre-drilled holes for bolts to pass through to an identical universal panel-connecting plate on the other side of the panels. When these two connecting plates—one on top of the panels to be held together and one directly underneath—are bolted together (with bolts of the right length passing through small holes, slits or openings in the "tube" or "pocket" panel covering), they serve the function of securely holding two or more panels of the present invention together.

Referring to FIG. 6, Number 15 represents a universal panel-connecting plate that, when used in pairs, can serve the purpose of joining and securely holding in place two or more of the panels of the present invention. In this drawing, universal panel-connecting plate is made in a square shape, but a rectangular shaped connecting plate could also be used, especially if desired in order for the plates to reach across slightly more of the surface area of the finished panels they are meant to hold together. This plate may be made of metal such as $\frac{1}{4}$" or $\frac{1}{2}$" thick galvanized steel.

It may also be constructed of aluminum or of any other suitable material that would be sturdy enough to accomplish the task of holding panels of the present invention together at their corners. Holes are pre-drilled in the positions shown (or in other positions on the connecting plate that may be required from time to time) so that bolts (or any type of suitable pin, rod, or other similar type of fastener) can be inserted through each hole, pass through small openings directly below them that have been made into the panel covering material, and then to pass through identically-spaced and pre-drilled holes on the universal panel-connecting plate on the opposite side of the panel of the present invention. Bolts should be selected so they are not too long, but rather so that they will be the right size to extend slightly beyond the second, or lower, plate and so that a nut of the proper size can be threaded onto the bolt's end and securely tightened. The Number 16 represents the center pre-drilled bole, and the Number 17 represents one of four other pre-drilled holes positioned outward from the center hole (each being in an operative position to hold the corners of each finished panel without having the bolt scrape against or damage the corner sections of any frame. The dotted lines in FIG. 6 represent the frame corners (covered with panel covering material and ready to be connected one to another) of four finished panels of the present invention.

Figure 7:
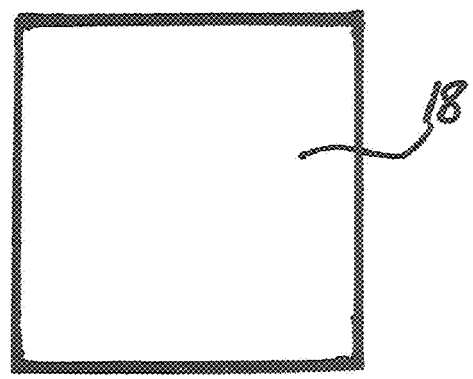
FIG. 7 illustrates a small, lightweight panel support cushion. It is sewn in a fashion similar to a small pillow, and it is useful for placing beneath any panel or panels of the present invention that may otherwise rest upon (or touch) another surface. The small cushion serves (in some applications) the purpose of creating a slight space between the panels of the present invention and the object or objects the panels are being used to protect. They are an optional feature, but may be utilized anywhere there is a need to ensure that no damage occurs to an existing surface.

Referring to FIG. 7, Number 18 represents the top side of a panel support cushion, made in a manner similar to the way in which a "knife-edge" toss pillow would be made. It may be made from any suitable material that is capable of being sewn; however an exemplary choice is to use the same type of panel covering material selected to make up the panel of the present invention's "tube" or "pocket". This may be a lightweight, low-density material such as commercially available shade fabric; and it may be made of polyethylene, polypropylene, polyester, and/or any type of knitted, woven or non-woven material desired. It may be filled with any suitable material; but prototype panel cushions already in use have been made of white polyethylene shade fabric with filling consisting of recycled plastic grocery bags. This makes a very durable and suitable cushion to place where panels come together and are joined by the universal panel-connecting plates. Panel cushion 18 may be used in any application when: a little space is desired between the panels of the present invention and the surfaces or objects they are being installed to protect.

They may also be used, even if extra space is not needed or desired, just to be sure that the panels of the present invention do not do damage to any other object or surface. There are no hard parts or surfaces in panel cushion 18.

Figure 8:
FIG. 8 illustrates an end view of the same panel support cushion as illustrated in FIG. 7. It shows that a seam has been sewn across a previously-open end of the cushion after the cushion has been stuffed or filled with a suitable filling material.

Referring to FIG. 8, the Number 19 represents the seam that was sewn to make panel cushion 18 closed and finished following the insertion of filling material. This view of cushion 18 is an end view. Cushion 18 can be made thicker or thinner depending upon how much or how little filling material is put inside it.

Figure 9:
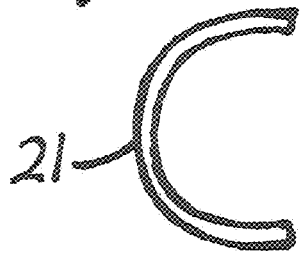
FIG. 9 illustrates an end view of the C-shaped clip, commercially available from horticultural supply companies such as Farm Tek, that may be used as an optional means of securing an open end or ends to the frame of the panel of the present invention.

Referring to FIG. 9, Number 21 represents one curved edge of a C-clip, as seen in an end view, which may be used as an alternate means of securing the open end of the "pocket" panel covering of the panel of the present invention This C-clip may also secure both ends of a "tube" panel covering of the new panel described herein if a "tube" is fabricated to cover the panel's frame rather than a "pocket". C-clips such as this are available from Farm Tek. They are normally approximately three inches in length, and one of them can be placed every twelve inches (or as needed) as panel covering open edges are brought together and slightly overlapped. A tool is not needed to utilize the C-clips. Pressure is applied to the C-clip with a slight rocking motion of the hand, when panel covering material is ready to be fastened. The C-clip is forced into place to hold the panel covering onto the panel of the present invention. Although these C-clips are not presently offered in longer lengths than three inches, the inventors of the panel of the present invention have found out that the manufacturer of this clip would make them available in longer lengths (for instance 12", 24", 48" or even as long as needed) so that fewer clips would be needed for each panel. A longer C-clip would most likely save time during assembly of the panels of the present invention.

Figure 10:
FIG. 10 illustrates another view of the C-shaped clip shown in FIG. 9.

Referring to FIG. 10, again, the number 21 represents one curved edge, or end, of the C-clip that may be used to fasten panel covering material to frame of the panel of the present invention. This view of the C-clip is from a different angle so that a side and the top of the C-clip may be seen. The number 20 represents one curved side of the C-clip.

Referring to FIG. 11, the number 8 represents a lightweight, low-density and highly-insulating panel covering "pocket" as shown and described in FIG. 2. The number 20 represents one of four C-clips that have been put into an operative position to secure the open edges of panel "pocket" 8 after it has been pulled onto (and surrounds) the panel frame. The number 22 represents one of three highly-insulating, NON-STRETCHY strips of material that has been sewn or affixed, in a crosswise position, onto the top or upper side of the panel of the present invention. They were sewn, attached or affixed onto the panel covering "pocket" before it was pulled onto and over the frame. They can be strips of a very thin material so that they do not extend very far above the surface of the panel covering 8; or, they may be made of a thicker, more "cushiony" material and thus they may be slightly raised or offset from the main panel covering 8. This may give the finished panel a "ribbed" look or effect; and it could serve (in some applications) to enhance the overall cooling and/or protective qualities of the panel of the present invention. The number 23 represents the same, or a different, type of highly-insulating, NON-STRETCHY strips of material that, in this case, have been sewn or affixed to panel covering 8 in a lengthwise position on the upper side of the new panel. Finished panels may have such strips affixed in an alternating pattern of several "crosswise" strips then several "lengthwise" strips, or all such NONSTRETCHY strips used on a single panel may be positioned in the same direction. Alternatively, they could be placed on and affixed to the panel in a diagonal, or "bias", direction if desired. In place of the "strips" or elongated rectangular shapes shown, the NON-STRETCHY material that may be integrated into the panel of the present invention may be in the shape of squares of any suitable size, or sewn circles/dots made of such a material although squares and dots are not shown in FIG. II. Many types of materials, in various shapes, may be added to either side of the panel of the present invention for performance, durability, aesthetic reasons, etc. And even with such NON-STRETCHY sections or components added to the panel covering material, the finished panel will still retain enough capacity to stretch in order to be self-tensioning when pulled onto and over the frame of the panel of the present invention.

Whereas, the devices and methods have been described in relation to the drawings and claims, it should be understood that other and further modifications, apart from those shown or suggested herein, may be made within the spirit and scope of this invention.

What is claimed is:

1. A system of modular panels for protecting a structure, comprising:
   at least one preformed or bent frame;
   at least one covering into which the frame is receivable, where the covering is made from shade fabric and is stretchy and pocket-shaped, such that the covering has at least one first layer, at least one second layer, a plurality of closed sides adjoining the first layer and the second layer, and at least one open side, such that the covering may be pulled onto the frame via the open side to form a self-tensioning modular panel; and
   at least one connecting plate assembly, each connecting plate assembly comprising two connecting plates and a plurality of fasteners, such that a connecting plate assembly may be used to join two or more modular panels into a larger unit by sandwiching one corner of each of the two or more modular panels between two connecting dates and joining the connecting plates together with the fasteners.

2. The system of modular panels of claim 1 further comprising fasteners located along the open side of the covering such that the open side of the covering may be closed after the covering has been pulled onto the frame.

3. The system of modular panels of claim 2 where the fasteners are hook and loop fasteners or c-clips.

4. The system of modular panels of claim 1 further comprising:
- an air space formed within the modular panel by the frame when the covering surrounds the frame; and
- insulation material within the air space.

5. The system of modular panels of claim 1 where the frame is comprised of four corner pieces and four side segments, where the four side segments connect to the four corner pieces to form a rectangular frame.

6. The system of modular panels of claim 1 where the frame is comprised of two u-shaped components and two side segments, where the two side segments connect to the two u-shaped components to form a rectangular frame.

7. The system of modular panels of claim 1 where the frame is made of flexible material such that the modular panel may conform to a curved structure to be protected by the modular panel.

8. The system of modular panels of claim 1 where the frame is foldable or collapsible.

9. The system of modular panels of claim 1 further comprising a plurality of panel support cushions.

10. The system of modular panels of claim 1 further comprising a fastener for mounting the at least one modular panel to an external surface of a structure.

11. The system of modular panels of claim 1 where the covering further comprises photovoltaic material whereby sunlight striking the modular panel can be converted into electricity.

12. A system of modular panels for protecting a structure, comprising:
- at least one preformed or bent frame, where the frame is comprised of two u-shaped components and two side segments, where the two side segments connect to the two u-shaped components to form a rectangular frame;
- at least one covering into which the frame is receivable, where the covering is made from shade fabric, such that the covering is stretchy and has at least one first layer, at least one second layer, a plurality of closed sides adjoining the first layer and the second layer, and at least one open side, such that the covering may be pulled onto the frame via the open side to form a self-tensioning modular panel, and where the covering further comprises at least one of the following features:
  - the covering is tube-shaped;
  - the covering further comprises photovoltaic material whereby sunlight striking the modular panel can be converted into electricity;
  - the covering is made from shade fabric that is water resistant;
  - the covering is made from shade fabric that is polyethylene combined with shade fabric that is polypropylene;
  - the covering is made from shade fabric used in combination with commercially-available hail-netting;
  - the covering further comprises strips or sections of non-stretchy material attached thereto; and
- at least one connecting plate assembly, each connecting plate assembly comprising two connecting plates and a plurality of fasteners, such that a connecting plate assembly may be used to join two or more modular panels into a larger unit by sandwiching one corner of each of the two or more modular panels between two connecting plates and joining the connecting plates together with the fasteners.

13. The system of modular panels of claim 12 further comprising at least one of the following features:
- a water misting system or a drip system, such that water may be delivered to the modular panels, providing enhanced cooling to a structure;
- an air space formed within the modular panel by the frame when the covering surrounds the frame and insulation material within the air space;
- the modular panels are capable of being turned or reversed from time to time to expand the life of the panels.

\* \* \* \* \*